United States Patent
Kim et al.

(10) Patent No.: US 9,385,292 B2
(45) Date of Patent: Jul. 5, 2016

(54) GEOTHERMALLY-COOLED SOLAR THERMOELECTRIC ENERGY HARVESTER

(75) Inventors: Kyoung Joon Kim, Busan (KR); Todd R. Salamon, New Providence, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 1098 days.

(21) Appl. No.: 13/293,214

(22) Filed: Nov. 10, 2011

(65) Prior Publication Data

US 2013/0118543 A1  May 16, 2013

(51) Int. Cl.
*H01L 35/02* (2006.01)
*H01L 35/32* (2006.01)
*H01L 35/04* (2006.01)

(52) U.S. Cl.
CPC .............. *H01L 35/32* (2013.01); *H01L 35/04* (2013.01)

(58) Field of Classification Search
CPC ...................................................... H01L 35/32
USPC ........................................................ 136/206
See application file for complete search history.

(56) References Cited

U.S. PATENT DOCUMENTS

| | | | | |
|---|---|---|---|---|
| 5,554,819 A * | 9/1996 | Baghai-Kermani | .......... | 136/206 |
| 2001/0000577 A1 * | 5/2001 | Parise | .......... | G01J 5/12 135/201 |
| 2005/0139250 A1 * | 6/2005 | DeSteese et al. | .......... | 136/212 |
| 2006/0021648 A1 * | 2/2006 | Parise | .......... | 136/259 |
| 2007/0125413 A1 * | 6/2007 | Olsen | .......... | H01L 35/08 136/205 |
| 2008/0017236 A1 * | 1/2008 | Perlo et al. | .......... | 136/201 |
| 2008/0023057 A1 * | 1/2008 | Nakajima et al. | .......... | 136/201 |
| 2008/0092940 A1 * | 4/2008 | Nakajima | .......... | 136/206 |
| 2008/0283110 A1 * | 11/2008 | Jin et al. | .......... | 136/206 |
| 2009/0152666 A1 * | 6/2009 | Luo | .......... | H01L 35/34 257/470 |
| 2010/0101621 A1 * | 4/2010 | Xu | .......... | 136/206 |
| 2010/0243017 A1 * | 9/2010 | Normann | .......... | H01M 10/443 136/205 |

OTHER PUBLICATIONS

R. Amatya and R. J. Ram, "Solar Thermoelectric Generator for Micropower Applications," J. of Electronic Materials, vol. 39, No. 9, 2010.

* cited by examiner

*Primary Examiner* — Golam Mowla
(74) *Attorney, Agent, or Firm* — Tong, Rea, Betley & Kim, LLC

(57) ABSTRACT

A solar thermoelectric generator (STEG) is disclosed. A STEG includes a thermoelectric generator (TEG) configured to convert light energy from solar light into electrical energy, and a heat transfer structure coupled to the TEG where a portion of the heat transfer structure is configured to be embedded in the earth. The TEG includes a first side and a second side, wherein the solar light is incident on the first side of the TEG and the heat transfer structure is configured to provide cooling for the second side of the TEG using geothermal cooling. The use of geothermal cooling to provide cooling for the second side of the TEG increases the temperature difference across the TEG of the STEG, thereby increasing the net generation efficiency of the STEG.

19 Claims, 6 Drawing Sheets

GEOTHERMALLY-COOLED SOLAR THERMOELECTRIC ENERGY HARVESTER

TECHNICAL FIELD

The invention relates generally to energy harvesters and, more specifically but not exclusively, solar thermoelectric energy harvesters.

BACKGROUND

In general, energy harvesting is a process by which energy is derived from an external source (e.g., solar radiation, wind, and the like) and captured, and stored. One type of energy harvester is the thermoelectric generator (TEG), which may be implemented as a solar TEG (STEG) or any other suitable type of TEG. The net energy generation efficiency of STEGs requires improvement in order for STEGs to compete with other solar energy harvesting techniques.

SUMMARY

Various deficiencies in the prior art are addressed by embodiments of a solar thermoelectric generator configured to use geothermal cooling.

In one embodiment, an apparatus includes a thermoelectric generator (TEG) configured to convert light energy from solar light into electrical energy, and a heat transfer structure coupled to the TEG where a portion of the heat transfer structure is configured to be embedded in the earth to provide cooling for a portion of the TEG via geothermal cooling.

In one embodiment, an apparatus includes a processor and a memory, in which the processor is configured to detect a condition associated with a thermoelectric generator (TEG) having a first side and a second side where the first side configured to receive incident solar light and, in response to the detected condition, switch between use of geothermal cooling to cool the second side of the TEG and use of heat rejection to ambient air to cool the second side of the TEG.

BRIEF DESCRIPTION OF THE DRAWINGS

The teachings herein can be readily understood by considering the following detailed description in conjunction with the accompanying drawings, in which.

To facilitate understanding, identical reference numerals have been used, where possible, to designate identical elements that are common to the figures.

DETAILED DESCRIPTION

In general, various solar thermoelectric generator (STEG) capabilities are depicted and described herein, although various other capabilities also may be presented herein.

In at least some embodiments, a STEG is configured in a manner for increasing the net energy generation efficiency of the STEG. A STEG includes a thermoelectric generator (TEG) configured to convert light energy from solar light into electrical energy. The TEG has a first side (typically referred to as the hot side) and a second side (typically referred to as the cold side). In general, the temperature difference across the TEG of a STEG is a physical parameter that affects the generation efficiency of the STEG. In at least some embodiments, a STEG is configured in a manner for increasing the temperature difference across the TEG of the STEG. In one embodiment, for example, the STEG includes a heat transfer structure configured to use geothermal cooling to provide cooling for the cold side of the TEG and, thus, increase the temperature difference across the TEG of the STEG. In one embodiment, for example, the STEG is configured to use a mechanism configured to reject heat to ambient air in order to reduce the temperature of the cold side of the TEG (via use of the ambient air) and, thus, increase the temperature difference across the TEG of the STEG. In one embodiment, the STEG is configured to use one or more of a solar light concentration mechanism, a light directing mechanism, and a light-absorbing coating for improving the efficiency with which solar light incident on the hot side of the TEG is captured by the hot side of the TEG, thereby enabling an increase in the temperature of the hot side of the TEG and, thus, increasing the temperature difference across the TEG of the STEG. In one embodiment, for example, the TEG of the STEG is configured to use one or more TEG pellet geometries configured to increase the temperature difference across the TEG (e.g., provided via one or more characteristics of the TEG pellet(s) of which the TEG is composed, such as shape, physical dimensions, cross-sectional area, and the like, as well as various combinations thereof) may be employed to increase the temperature difference across the TEG of a STEG. It is noted that various other features and embodiments may be used to increase the temperature difference across the TEG of the STEG. It is further noted that combinations of such features and embodiments may be employed to increase the temperature difference across the TEG of the STEG. It is further noted that other features and embodiments may be used to increase the net energy generation efficiency of STEG.

Figure 1:
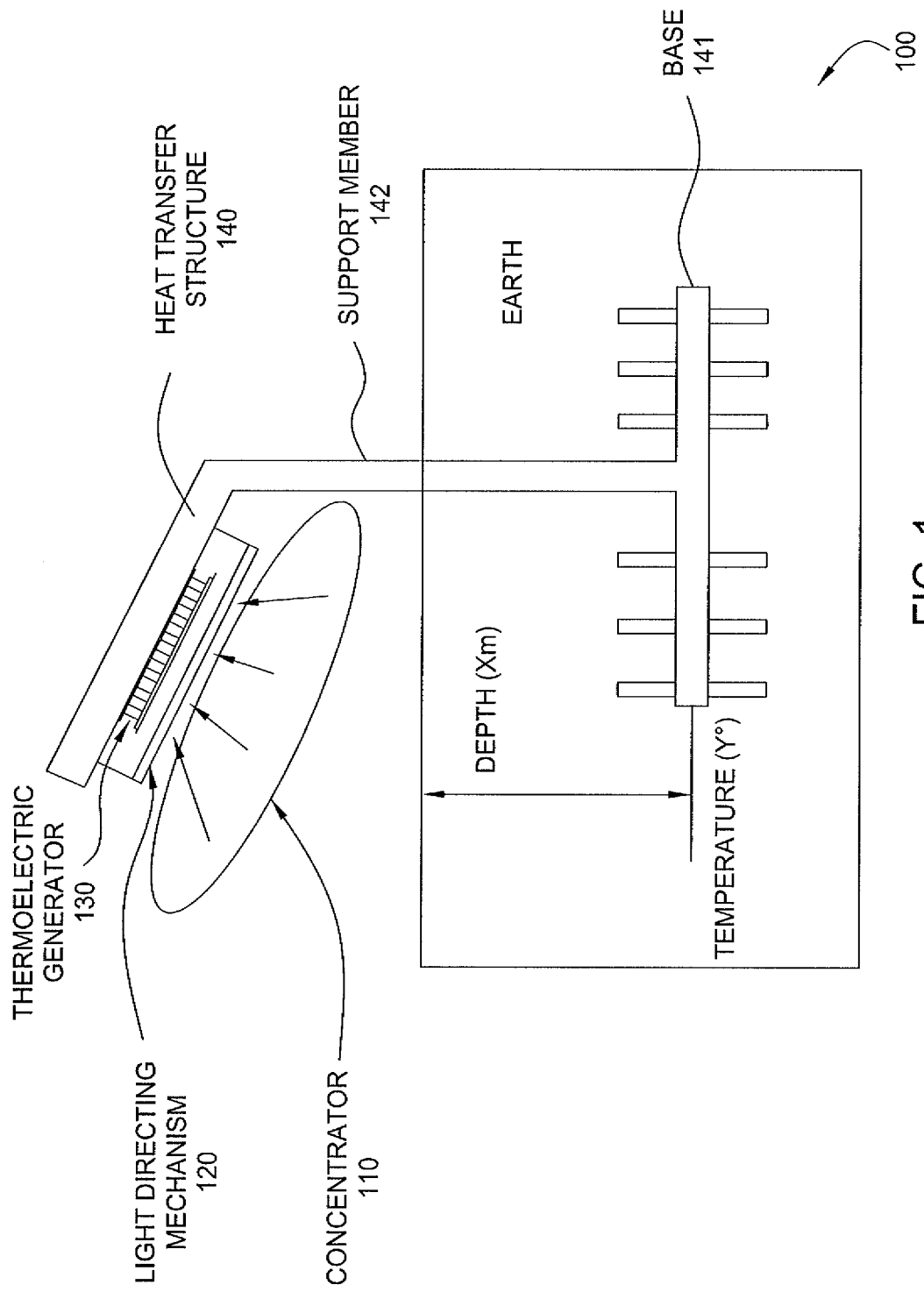
FIG. 1 depicts one embodiment of a solar thermoelectric generator configured to use geothermal cooling.

FIG. 1 depicts one embodiment of a solar thermoelectric generator configured to use geothermal cooling.

The STEG 100 includes a concentrator 110, a light directing mechanism 120, a thermoelectric generator (TEG) 130, and a heat transfer structure 140.

The concentrator 110 is configured to concentrate incident solar light on TEG 130 (namely, on the hot side of the TEG 130), thereby increasing the intensity of the incident solar light captured from the environment and, thus, improving the net generation efficiency of TEG 130. The concentrator 110 may be any type of concentrator suitable for concentrating solar light (e.g., a lens, a mirror, and the like). In one embodiment, concentrator 110 may be a parabolic concentrator (e.g., a parabolic lens or other suitable parabolic reflector). The concentrator 110 may be referred to more generally herein as a solar light concentration mechanism. In one embodiment, as depicted in FIG. 1, concentrator 110 concentrates the incident solar light on light directing mechanism 120 which then focuses the light on TEG 130. It is noted that, in at least one embodiment, concentrator 110 may be omitted.

The light directing mechanism 120 is configured to focus the incident solar light on TEG 130, (namely, on the hot side of the TEG 130), thereby increasing the amount of the light captured from the environment that is incident on TEG 130 and, thus, improving the net generation efficiency of the TEG 130. In one embodiment, as depicted in FIG. 1, the light directing mechanism 120 focuses incident solar light from concentrator 110 on TEG 130. The light directing mechanism 120 may be any suitable type of light directing mechanism (e.g., a Fresnel lens, an array of mirrors, and the like). In the exemplary embodiment of FIG. 1, light directing mechanism 120 is depicted as a Fresnel lens. It is noted that, in at least one embodiment, light directing mechanism 120 may be omitted.

The TEG 130 is configured to convert light energy from the incident solar light into electrical energy. The TEG 130 absorbs light energy in the form of light, converts the absorbed light into thermal energy in the form of heat, and converts the thermal energy into electrical energy (e.g., due to the Seebeck effect). The thermal energy is converted into electrical energy via conduction of the heat through the TEG 130, where the amount of electrical energy that is generated by TEG 130 from the thermal energy is dependent on the temperature difference across the TEG 130. The electrical energy generated by TEG 130 may be used and/or stored for later use. It is noted that exemplary embodiments of TEG 130 (and associated mechanisms adapted for increasing the net energy efficiency of TEG 130) are depicted and described with respect to FIGS. 2 and 3.

Figure 2:
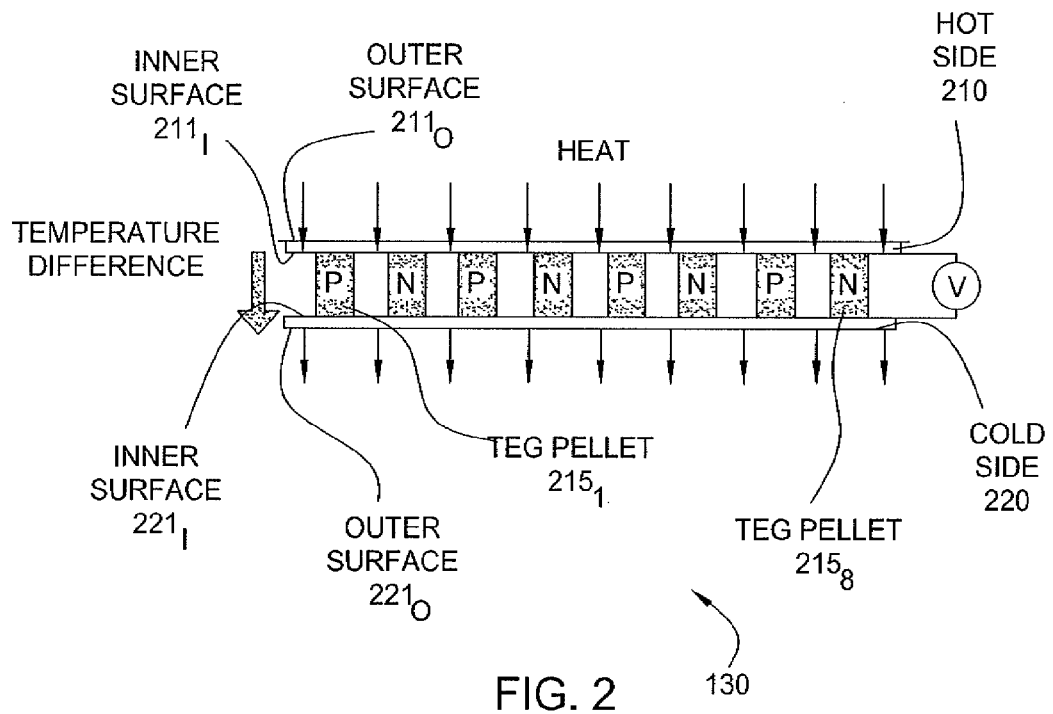
FIG. 2 depicts one embodiment of the TEG of the STEG of FIG. 1, illustrating use of the TEG for generating electrical energy.

FIG. 2 depicts one embodiment of the TEG of the STEG of FIG. 1, illustrating use of the TEG for generating electrical energy.

As depicted in FIG. 2, TEG 130 includes a hot side 210 and a cold side 220 with a plurality of TEG pellets $215_1$-$215_8$ (collectively, TEG pellets 215) disposed therebetween.

The hot side 210 and cold side 220 of TEG 130 may be implemented in any suitable manner. In one embodiment, for example, hot side 210 and cold side 220 of TEG 130 may be implemented using a material that tends to be thermally conductive and electrically insulating (e.g., as ceramic plate or using any other suitable type(s) of material(s)). The type(s) of material(s) typically used for the hot and cold sides of a TEG will be understood by one skilled in the art.

The hot side 210 has an outer surface $211_O$ and an inner surface $211_I$. The outer surface $211_O$ is adapted to absorb incident solar light that is incident on the TEG 130. The hot side 210 is configured to conduct heat from the outer surface $211_O$ to the inner surface $211_I$. The inner surface $211_I$ is coupled to respective first ends of the TEG pellets 215 via an electrically conductive material connecting the TEG pellets 215. In one embodiment, the inner surface $211_I$ is configured such that a portion of the inner surface $211_I$ is in contact with an electrically-conductive material that electrically connects the TEG pellets 215. In this manner, the hot side 210 is configured to conduct heat from the outer surface $211_O$ to the inner surface $211_I$ such that the heat may be conducted through the TEG pellets 215 toward the cold side 220.

The cold side 220 has an inner surface $221_I$ and an outer surface $221_O$. The inner surface $221_I$ is coupled to respective second ends of the TEG pellets 215 via an electrically conductive material connecting the TEG pellets 215. The inner surface $221_I$ is adapted to receive heat conducted from the hot side 210 through the TEG pellets 215. The cold side 220 is configured to conduct heat from the inner surface $221$, to the outer surface $221_O$. The outer surface $221_O$ is coupled to heat transfer structure 140 such that heat transfer structure 140 can cool the cold side 220 of TEG 130.

The TEG pellets 215 are disposed between hot side 210 and cold side 220. The TEG 130 includes four pairs of TEG pellets 215 (with TEG pellets $215_1$ and $215_2$ forming a first TEG pellet pair, TEG pellets $215_3$ and $215_4$ forming a second TEG pellet pair, TEG pellets $215_5$ and $215_6$ forming a third TEG pellet pair, and TEG pellets $215_7$ and $215_8$ forming a fourth TEG pellet pair), where each pair of TEG pellets 215 includes a P-doped TEG pellet 215 and an N-doped TEG pellet 215. In general, the use of TEG pellets in a TEG to generate electrical energy from thermal energy will be understood by one skilled in the art. It is noted that the associated electrical coupling of the TEG pellets 215 is omitted for purposes of clarity. In one embodiment, one or more TEG pellets 215 has an associated pellet geometry (e.g., provided via one or more characteristics of the TEG pellet(s) 215, such as physical dimensions, cross-sectional area, and the like, as well as various combinations thereof) that is configured to increase the temperature difference across the TEG 130 and, thus, improve the net generation efficiency of the TEG 130. Although primarily depicted and described with respect to use of eight TEG pellets 215 (and, thus, four pairs of TEG pellets 215), it will be appreciated that TEG 110 may include fewer or more TEG pellets 215.

As described with respect to FIG. 1 and depicted in FIG. 2, solar light is incident on the hot side 210 of TEG 130, the incident solar light is converted into heat, and the heat conducts from the hot side 210 of TEG 130 through the TEG pellets 215 to the cold side 220 of TEG 130. The TEG 130 converts the thermal energy into electrical energy (e.g., due to the Seebeck effect). The generation of electrical energy is represented by voltage element V. The electrical energy generated from the solar light may be used and/or stored for later use. The amount of electrical energy that is generated by TEG 130 in this manner is dependent on the temperature difference between the hot side 210 of the TEG 130 and the cold side 220 of TEG 130. As described herein, the temperature difference between the hot side 210 of the TEG 130 and the cold side 220 of TEG 130 may be increased using one of more features, e.g., by using one or more components to increase the temperature of the hot side 210 of the TEG (e.g., by using a concentrator such as concentrator 110 to concentrate the solar light on the hot side 210 of TEG 130, by using a light directing mechanism such as light directing mechanism 120 to focus the solar light on the hot side 210 of TEG 130, by using a light-absorbing coating on the hot side 210 of TEG 130, and the like), by using the heat transfer structure 140 to lower the temperature of the cold side 220 of TEG 130, and the like, as well as various combinations thereof. An exemplary embodiment is depicted and described with respect to FIG. 3.

Figure 3:
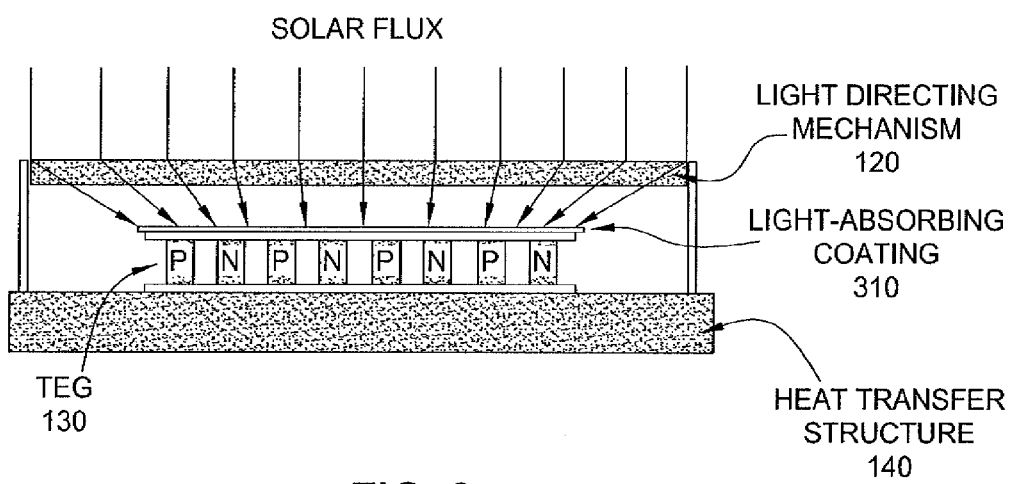
FIG. 3 depicts one embodiment of the TEG of the STEG of FIG. 1, illustrating exemplary mechanisms for maintaining a temperature difference across the TEG.

FIG. 3 depicts one embodiment of the TEG of the STEG of FIG. 1, illustrating exemplary mechanisms for maintaining a temperature difference across the TEG.

As depicted in FIG. 3, solar light is incident on the TEG 130, the solar light is converted into thermal energy which conducts from hot side 210 through TEG pellets 215 to cold side 220, and the TEG 130 converts the thermal energy into electrical energy, where the net energy generation efficiency is dependent on the temperature difference between the hot side 210 and the cold side 220 of the TEG 130.

In one embodiment, as depicted in FIG. 1 and described herein, light directing mechanism 120 is used to focus the incident solar light on the hot side 210 of TEG 130. In the exemplary embodiment of FIG. 1, light directing mechanism 120 is depicted as a Fresnel lens. The light directing mechanism 120 is configured to increase the temperature of the hot side 210 of the TEG 130, thereby improving the net generation efficiency of TEG 130.

In one embodiment, the hot side 210 of TEG 130 includes a light-absorbing coating 310. In one embodiment, in which the hot side 210 of TEG 130 includes light-absorbing coating 310, light directing mechanism 120 is configured to focus the incident solar light on the light-absorbing coating 310 on the hot side 210 of TEG 130. The light-absorbing coating 310 may be any suitable type of coating. The light-absorbing coating 310 is configured to increase the temperature of the hot side 210 of the TEG 130, thereby improving the net generation efficiency of TEG 130.

Returning now to FIG. 1, it is noted that heat transfer structure 140 is configured to increase the temperature difference across TEG 130 by using geothermal cooling to reduce the temperature of the cold side 220 of TEG 130, thereby improving the net generation efficiency of TEG 130. As depicted in FIG. 1, heat transfer structure 140 provides geothermal cooling of the cold side 220 of TEG 130 via embedding of a portion of heat transfer structure 140 in the earth. As a result, the STEG 100 also may be referred to herein as a geothermally cooled solar thermoelectric energy harvester (GSTEH).

In one embodiment, the heat transfer structure 140 includes a base 141 and a support member 142 attached to the base 141.

The base 141 of heat transfer structure 140 is embedded within the earth. The base 141 may be embedded to any suitable depth within the earth. The depth to which the base 141 is embedded may depend on the latitude at which the STEG 100 is deployed. In one embodiment, for example, the base 141 is embedded between about one meter and two meters below the surface. In one embodiment, for example, the base 141 is embedded at or near 1.2 meters below the surface. In one embodiment, for example, the base 141 is embedded between about two and three meters below the surface. It is noted that there may be certain depths at which the temperature of the earth is substantially constant. It is further noted that there may be certain depths at which the temperature of the earth may vary by a range around an associated average temperature of the earth. It is further noted that that there may be certain depths at which the temperature of the earth may considered to be substantially constant in that it tends to vary within a range around an associated average temperature of the earth. It is further noted that the degree of variation around the average temperature at a certain depth may depend on factors such as the latitude at which the STEG 100 is deployed, the extent of seasonal variations in the temperature above the surface at the latitude at which the STEG 100 is deployed, and the like. For example, there may be seasonal variation of +5° C./−5° C. around an average temperature of 13° C. at a depth of 1.2 meters. Thus, the base 141 may be embedded at any other suitable depth, and the depth at which the base 141 is embedded may be determined based on one or more factors.

The base 141 may be any suitable shape or size. In one embodiment, the base 141 is adapted to increase the surface area of the base 141, thereby improving the cooling efficiency of the base 141 of heat transfer structure 140 and, thus, improving the cooling efficiency of heat transfer structure 140. It is noted that the surface area of a cooling mechanism, such as base 141, may be increased in a number of ways understood by one skilled in the art (e.g., via use of fins as depicted in FIG. 1 and/or other shapes/elements suitable for use in increasing the surface area of the cooling mechanism).

The support member 142 is partially embedded in the earth and partially extended above the earth. The cold side 220 of the TEG 130 is coupled to a portion of the support member 142 that extends above the surface of the earth. The support member 142 may be any suitable shape or size.

It is noted that although depicted and described with respect to an embodiment in which the base 141 is entirely embedded within the earth and the support member 142 is partially embedded within the earth, other configurations are possible. In one embodiment, for example, at least a portion of the base 141 extends above the surface of the earth and the entire support member 142 is located above the surface of the earth. It is noted that other configurations are contemplated.

It is further noted that the design of heat transfer structure 140 (e.g., shape, orientation, and the like) is exemplary and, thus, that any other suitable heat transfer structure design may be used to provide heat transfer structure 140.

The heat transfer structure 140 is configured to cool the cold side 220 of TEG 130 by transferring heat away from the cold side 220 of TEG 130 toward the base 141 of heat transfer structure 140 via the support member 142 of heat transfer structure, such that transferred heat may be dissipated via geothermal cooling resulting from embedding of the base 141 of heat transfer structure 140 in the earth. The heat transfer structure 140 may use a passive cooling mechanism (e.g., using a thermally conductive material for heat transfer structure 140, using one or more heat pipes within heat transfer structure 140, or using any other suitable passive cooling mechanism) and/or an active cooling mechanism (e.g., use of a cooling fluid and associated fluid pump for pumping the fluid within the heat transfer structure 140, or using any other suitable active cooling mechanism) for transferring heat from the cold side 220 of TEG 130 toward the base 141 of heat transfer structure 140. At least some such embodiments are described in additional detail below.

In one embodiment, heat transfer structure 140 is composed of a material suitable for conducting heat from the cold side 220 of the TEG 130 toward the base 141 of heat transfer structure 140. In one embodiment, for example, the heat transfer structure 140 is made of pyrolytic graphite, which has a thermal conductivity in the range of about 1300 to 1500 W/(m-K) in the plane of the pyrolytic graphite. It is noted that the heat transfer structure 140 may be composed of any other material suitable for conducting heat away from the cold side 220 of the TEG 130 and toward the base 141 of the heat transfer structure 140. It is further noted that, in such embodiments, the heat transfer structure 140 may be a solid structure (or a configuration of multiple solid structures) or may be implemented in any other suitable manner.

In one embodiment, heat transfer structure 140 includes a heat pipe configured for conducting heat from the cold side 220 of the TEG 130 toward the base 141 of heat transfer structure 140. An exemplary embodiment illustrating use of a heat pipe within a heat transfer structure is depicted and described with respect to FIG. 4.

Figure 4:
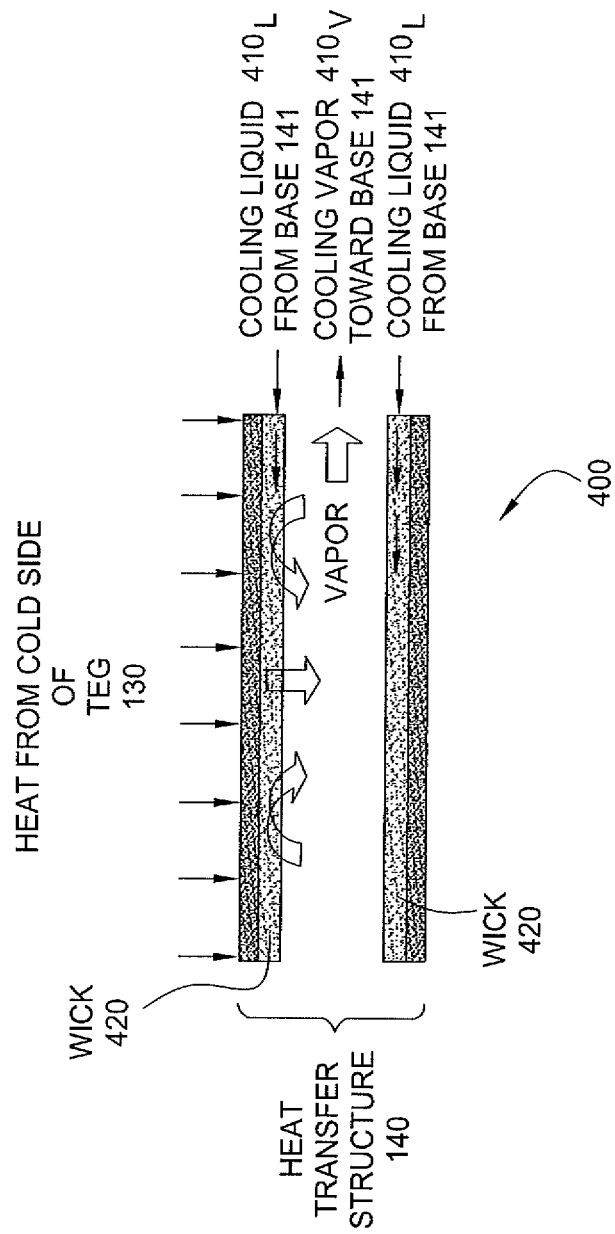
FIG. 4 depicts one embodiment of a heat pipe for use in the heat transfer structure of FIG. 1.

FIG. 4 depicts one embodiment of a heat pipe for use in the heat transfer structure of FIG. 1.

As depicted in FIG. 4, the heat transfer structure 140 includes a heat pipe 400 where the outer portion of the heat transfer structure 140 forms a casing within which the heat pipe 400 is enclosed.

The heat pipe 400 includes a cooling fluid 410 (including a cooling liquid phase $410_L$ and a cooling vapor phase $410_V$) and a wick 420.

The cooling fluid 410 and the wick 420 of heat pipe 400 are configured to geothermally cool the cold side 220 of TEG 130. The cooling liquid $410_L$ moves, via the wick 420 (i.e., via capillary action in the wick 420), in a direction from the base 141 of heat transfer structure 140 toward the portion of the support member 142 of heat transfer structure 140 that is adjacent to TEG 130. The cooling liquid 410$_L$ absorbs thermal energy from the cold side 220 of TEG 110 and evaporates to form cooling vapor 410$_V$. The cooling vapor 410$_V$ moves in a direction from the portion of the support member 142 of heat transfer structure 140 that is adjacent to TEG 130 toward the base 141 of heat transfer structure 140, thereby using convection to transport the heat from TEG 130 toward the base 141 of heat transfer structure 140. The cooling vapor 410$_V$ is cooled at the base 141 of heat transfer structure 140, geothermally due to the temperature of the earth within which the base 141 is embedded, thereby resulting in condensation of the cooling vapor 410$_V$ back into the cooling liquid 410$_L$. The cooling liquid 410$_L$ is then transported, via the wick 420, from the base 141 of heat transfer structure 140 back toward the portion of the support member 142 of heat transfer structure 140 that is adjacent to TEG 130.

The cooling fluid 410 and the wick 420 of heat pipe 400 may be provided using any suitable materials. The cooling fluid 410 may be any suitable type of cooling fluid (e.g., water or any other suitable liquid). The wick 420 may be implemented using any suitable material (e.g., a sponge-like material or any other suitable material supporting capillary action for transferring the cooling fluid 410 from the base 141 toward the portion of heat transfer structure 140 adjacent to TEG 130.

In this manner, heat pipe 400 is configured such that cooling fluid 410 circulates within heat transfer structure 140, thereby transferring heat from the cold side 220 of TEG 130 to the base 141 of the heat transfer structure 140.

It is noted that the heat pipe 400, at least partially due to the benefit of two phase heat transfer physics, has a relatively high effective thermal conductivity. For example, the heat pipe 400 may have an effective thermal conductivity on the order of several thousand W/mK (e.g., approximately 1000 W/mK-100,000 W/mK).

It is noted that heat pipe 400 may be implemented using any suitable type of heat pipe. In at least some embodiments, for example, the heat pipe 400 may be a loop heat pipe. In general, loop heat pipes are able to pump fluid over relatively long distances. In at least some embodiments, for example, the heat pipe 400 may be a capillary pumped loop heat pipe.

Returning again to FIG. 1, it is noted that various embodiments of heat transfer structure 140 (e.g., the above-described embodiments, other suitable embodiments, and the like) enable use of geothermal cooling to maintain the cold side 220 of TEG 130 at a relatively low temperature. As noted above, use of geothermal cooling reduces the temperature of the cold side 220 of TEG 130 and, thus, improves the net efficiency of TEG 130 and results in better performance of TEG 130.

Although primarily depicted and described herein with respect to embodiments of heat transfer structure 140 including a single heat pipe, in at least one embodiment the heat transfer structure 140 may include multiple heat pipes for transferring heat away from cold side 220 of TEG 130. In an embodiment in which the heat transfer structure 140 includes multiple heat pipes, the multiple heat pipes may be used in parallel and/or in series in the heat transfer structure 140 for transferring heat away from cold side 220 of TEG 130.

Although primarily depicted and described herein with respect to embodiments of heat transfer structure 140 using a passive cooling mechanism (e.g., using a thermally conductive material for heat transfer structure 140, using one or more heat pipes within heat transfer structure 140, or using any other suitable passive cooling mechanism) for transferring heat away from cold side 220 of TEG 130, in at least one embodiment the heat transfer structure 140 may include an active cooling mechanism for transferring heat away from cold side 220 of TEG 130. In one embodiment, for example, heat transfer structure 140 uses an active cooling mechanism that includes a cooling fluid and a pump. In this embodiment, the cooling fluid absorbs heat from the cold side 220 of TEG 130 such that the cooling fluid becomes heated, the heated cooling fluid flows within heat transfer structure 140 toward base 141 of heat transfer structure 140 via support member 142 of heat transfer structure, the heated cooling fluid is geothermally cooled while in the base 141 of heat transfer structure 140, and the cooled cooling fluid is pumped back up to the portion of the heat transfer structure 140 to which TEG 140 is coupled such that the process may continue to cool the cold side 220 of heat transfer structure 140. The heat transfer structure 140 may use any other suitable active cooling mechanism for transferring heat away from cold side 220 of TEG 130. Although primarily depicted and described herein with respect to use of a single active cooling mechanism to cool a single TEG, in one embodiment a single active cooling mechanism is used to cool multiple TEGs (e.g., where a single active cooling mechanism is configured to distribute a cooling fluid in parallel to the multiple TEGs such that each TEG receives portions of the cooling fluid at or substantially near the same temperature).

Although primarily depicted and described herein with respect to embodiments in which STEG 100 is configured such that the TEG 130 is located above the surface of the earth, in at least one embodiment STEG 100 may be configured such that the TEG 130 is located below the surface of the earth. In one embodiment, TEG 130 may be placed below the surface of the earth within a structure that includes a hollow light pipe, or similar device, that permits the transmittal of light onto the hot side 210 of TEG 130. It is noted that this embodiment is advantageous when a heat pipe 400 is used to reduce the temperature of the cold side 220 of TEG 130. In one embodiment, for example, the heat pipe 400 may operate in a horizontal or substantially horizontal position such that the performance of heat pipe 400 is neutral with respect to gravity. In one embodiment, for example, the heat pipe 400 may operate in a vertical or substantially vertical position, with the evaporator section of the heat pipe 400 below the condenser section of the heat pipe 400, such that the performance of heat pipe 400 is aided by gravity.

In one embodiment, STEG 100 is configured to reduce the temperature of the cold side 220 of TEG 130 by rejecting heat from the cold side 220 of the TEG 130 to ambient air. An exemplary embodiment is depicted and described with respect to FIG. 5.

Figure 5:
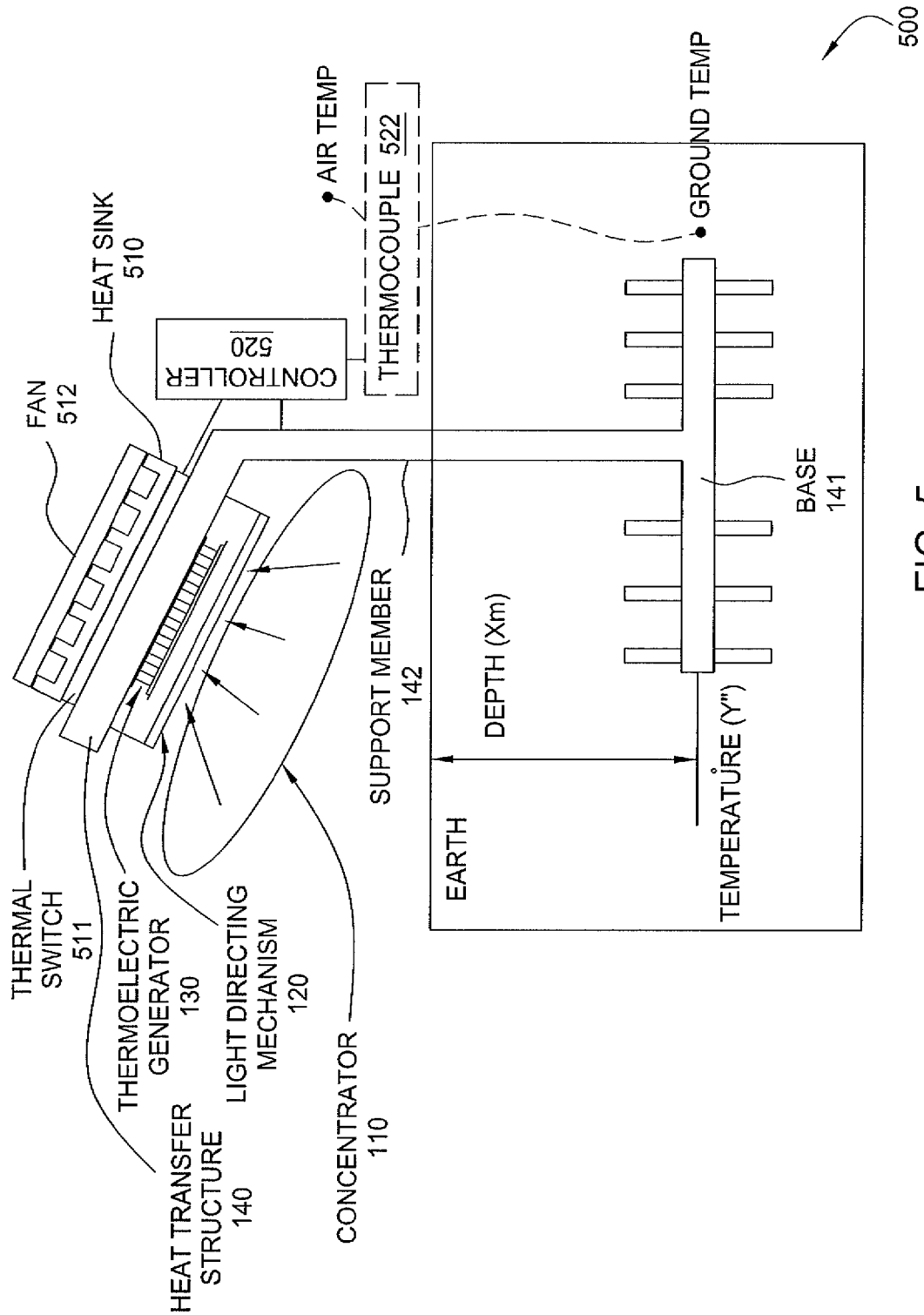
FIG. 5 depicts one embodiment of a solar thermoelectric generator configured to use geothermal cooling or rejection of heat to ambient air.

FIG. 5 depicts one embodiment of a solar thermoelectric generator configured to use geothermal cooling or rejection of heat to ambient air.

As depicted in FIG. 5, the solar thermoelectric generator (STEG) 500 of FIG. 5 is a modified version of STEG 100 of FIG. 1. The STEG 500 of FIG. 5, in addition to the elements of STEG 100 of FIG. 1, is configured to include a heat sink 510 and a controller 520.

The STEG 500 of FIG. 5 is configured to switch between cooling the cold side 220 of the STEG 500 via geothermal cooling and cooling the cold side 220 of STEG 500 via rejection of heat to ambient air. It is noted that switching between such cooling mechanisms may be performed under various conditions. It is noted that switching between such cooling mechanisms may be performed statically or dynamically.

The heat sink 510 is a mechanism configured to reject heat from the cold side 220 of TEG 500 to ambient air.

The heat sink 510 may be any suitable type of heat sink having any suitable design. In one embodiment, for example, as depicted in FIG. 5, heat sink 510 may include a base and a plurality of fins configured to provide dissipation of heat to ambient air.

The heat sink 510 may be attached to heat transfer structure 140 at or near the cold side 220 of the TEG 130 or in any other suitable location.

In one embodiment, depicted in FIG. 5, the heat sink 510 may be connected to heat transfer structure 140 via a thermal switch 511 configured to be toggled between two modes, including an ON mode in which the thermal switch 511 is thermally conductive (thereby enabling heat to be conducted from the cold side 220 to the heat sink 510) and an OFF mode in which the thermal switch 511 is thermally insulating (thereby preventing heat from being conducted from the cold side 220 to the heat sink 510). The thermal switch 511 may be implemented in any suitable manner. In one embodiment, for example, the thermal switch 511 is implemented using one or more variable-conductance heat pipes. It will be appreciated that a variable-conductance heat pipe is configured to operate as a thermal switch which may be toggled between two modes, including an ON mode in which the variable-conductance heat pipe is thermally conductive (e.g., thereby enabling heat to be conducted from the cold side 220 to the heat sink 510) and an OFF mode in which the variable-conductance heat pipe is thermally insulating (e.g., thereby preventing heat from being conducted from the cold side 220 to the heat sink 510).

In one embodiment, which is omitted from FIG. 5, the heat sink 510 may be directly connected to heat transfer structure 140. In this embodiment, the terminal switch 511 would not be present, such that the base of heat sink 510 would connect directly to heat transfer structure 140.

The heat sink 510 may be a convection cooled heat sink. In one embodiment, depicted in FIG. 5, heat sink 510 may be a forced convection cooled heat sink (e.g., using a fan, such as fan 512 depicted in FIG. 5, or using any other suitable cooling device or mechanism). In one embodiment, which is omitted from FIG. 5, heat sink 510 may be a natural convection cooled heat sink. Although primarily depicted and described with respect to using a specific type of mechanism to reject heat to ambient air (illustratively, heat sink 510), it is noted that any other suitable mechanism configured to reject heat to ambient air may be used with STEG 500.

The controller 520 is configured to determine when STEG 500 uses geothermal cooling to cool the cold side 220 of STEG 500 and when STEG 500 uses rejection of heat to ambient air to cool the cold side of STEG 500, including determining when to switch between using these two types of cooling to cool the cold side 220 of STEG 500. The controller 520 is configured to generate and provide one or more control signals adapted for use in switching STEG 500 between using geothermal cooling and using rejection of heat to ambient air.

In one embodiment, controller 520 is configured to use heat sink 510 to reject heat from the cold side 220 of STEG 500 to ambient air, rather than using geothermal cooling via heat transfer structure 140, depending upon at least one of the temperature of the ambient air and the temperature of the earth (e.g., the temperature of the earth at or near the base 141, as this is the temperature that would be used to cool the cold side 220 of TEG 130 using geothermal cooling via heat transfer structure 140).

In one embodiment, for example, controller 520 is configured to use heat sink 510 to reject heat from the cold side 220 of STEG 500 to ambient air, rather than using heat transfer structure 140 to reject heat from the cold side 220 of STEG 500 via geothermal cooling, when the temperature of the ambient air is below a threshold. In one such embodiment, the value of the threshold may be dependent on at least one of the temperature of the earth and a relative heat transfer efficiency associated with the mechanism used to reject heat from the cold side 220 of the STEG 500 via geothermal cooling (e.g., heat transfer structure 140 of STEG 500) and the mechanism configured to reject heat from the cold side 220 of the STEG 500 to ambient air (e.g., heat sink 510).

In one embodiment, for example, controller 520 is configured to use heat sink 510 to reject heat from the cold side 220 of STEG 500 to ambient air, rather than using heat transfer structure 140 to reject heat from the cold side 220 of STEG 500 via geothermal cooling, when the temperature of the ambient air is close to or below the temperature of the earth.

In such embodiments, the controller 520 may obtain the temperature(s) in any suitable manner. In one embodiment, for example, as depicted in FIG. 5, the controller 520 may have connected thereto a thermocouple 522 configured to measure a temperature difference between the ambient air and the ground. In one embodiment, for example, the controller 520 may have access to temperature readings for the temperature of the ambient air and, optionally, for the temperature of the earth. It is noted that controller 520 may obtain the required temperature information in any other suitable manner.

The STEG 500 may be statically or dynamically configured (e.g., via configuration of controller 520) to switch between using geothermal cooling to cool the cold side 220 of STEG 500 and using rejection of heat to ambient air to cool the cold side of STEG 500.

In one embodiment, for example, where advance analysis of the details of deployment of STEG 500 results in a determination that it may be beneficial to use heat rejection to ambient air for part of the year (e.g., winter months) and geothermal cooling via the heat transfer structure 140 for the remainder of the year (e.g., spring, summer, and fall months), the STEG 500 may be configured (e.g., via configuration of controller 520) to switch between use of heat rejection to ambient air and use of geothermal cooling via the heat transfer structure 140 at particular times. For example, controller 520 may be configured to monitor a local clock or timer which may be used to switch between use of heat rejection to ambient air and use of geothermal cooling via the heat transfer structure 140 (e.g., at a particular latitude having certain associated characteristics, to switch from using geothermal cooling to using heat rejection to ambient air on November $1^{st}$ and to switch from using heat rejection to ambient air to using geothermal cooling on March $1^{st}$).

In one embodiment, for example, where advance analysis of the details of deployment of STEG 500 results in a determination that it may be beneficial to use heat rejection to ambient air for part of the day (e.g., from sunrise until midmorning and from mid-afternoon until sunset) and geothermal cooling via the heat transfer structure 140 for the other part of the day (e.g., during the middle part of the day from mid-morning until mid-afternoon), the STEG 500 may be configured (e.g., via configuration of controller 520) to switch between use of heat rejection to ambient air and use of geothermal cooling via the heat transfer structure 140 at particular times. For example, controller 520 may be configured to monitor a local clock or timer which may be used to switch between use of heat rejection to ambient air and use of geothermal cooling via the heat transfer structure 140 (e.g., to switch from using heat rejection to ambient air to using geothermal cooling at 9:00 AM and to switch from using geothermal cooling to using heat rejection to ambient air at 5:00 PM and).

In one embodiment, for example, STEG 500 may be configured (e.g., via configuration of controller 520) to dynamically switch between use of heat rejection to ambient air and geothermal cooling via the heat transfer structure 140 based on monitoring of one or more temperatures associated with STEG 500 (e.g., based on the temperature of the ambient air near STEG 500, based on a difference between the temperature of the ambient air near STEG 500 and the temperature of the earth at or near the base 141 of STEG 500, and the like). For example, where the STEG 500 is currently using heat rejection to ambient air and detects a switch condition (e.g., the temperature of the earth is less than the temperature of the ambient air, the temperature of the earth is less than the temperature of the ambient air by more than a threshold amount, and the like), the STEG 500 is configured to switch from using heat rejection to ambient air to using geothermal cooling via the heat transfer structure 140. Similarly, for example, where the STEG 500 is currently using geothermal cooling via the heat transfer structure 140 and detects a switch condition (e.g., the temperature of the earth is greater than the temperature of the ambient air, the temperature of the earth is greater than the temperature of the ambient air by more than a threshold amount, and the like), the STEG 500 is configured to switch from using geothermal cooling via the heat transfer structure 140 to using heat rejection to ambient air. In such embodiments, the controller 520 may obtain the temperature(s) in any suitable manner (e.g., using one or more thermocouples, one or more temperature sensors, and the like, as well as various combinations thereof).

It is noted that a determination as to whether to use geothermal cooling or heat rejection to ambient air to cool the cold side 220 of STEG 500, and similarly, as to when to switch between using these two cooling mechanisms, may depend on various details of the particular application for which STEG 500 is used. It will be appreciated that one skilled in the art would know how to perform this type of evaluation.

It is noted that, depending on various factors (e.g., depth of the base 141, latitude at which STEG 500 is deployed, and the like, as well as various combinations thereof), heat rejection to ambient air may be utilized at various times and/or for various lengths of time. For example, this embodiment may be used throughout the year when base 141 of STEG 500 is approximately X meters below the surface of the earth and when the STEG 500 is deployed at certain latitudes, where the temperature of the earth X meters below the surface at such latitudes tends to remain above the temperature of the ambient air throughout the year. For example, this embodiment may be used when the base 141 of STEG 500 is approximately 2 to 3 meters below the surface of the earth and when the STEG 500 is deployed at certain latitudes, where the temperature of the earth 2 to 3 meters below the surface at such latitudes tends to be below the temperature of the ambient air during part of the year (e.g., during the summer) and above the temperature of the ambient air during part of the year (e.g., during the winter). Similarly, for example, this embodiment may be used when the base 141 of STEG 500 is approximately 2 to 3 meters below the surface of the earth and when the STEG 500 is deployed at certain latitudes, where the temperature of the earth 2 to 3 meters below the surface at such latitudes tends to be below the temperature of the ambient air during part of the day (e.g., during the middle part of the day) and above the temperature of the ambient air during part of the day (e.g., between sunrise and mid-morning and between mid-afternoon and sunset). It is noted that use of the range of 2-3 meters in the foregoing examples is based on an assumption that the temperature of the earth is typically between the minimum and maximum air temperatures throughout the year at a depth of approximately 2-3 meters below the surface of the earth and, thus, that these references to the range of 2-3 meters may be read more generally as being references to a depth of X units below the surface of the earth (i.e., any suitable depth or range of depths).

As noted above, the controller 520 is configured to generate and provide one or more control signals adapted for use in switching STEG 500 between using geothermal cooling and using rejection of heat to ambient air. The control signals may be generated and provided in any suitable manner. The control signals may be generated and provided for use by any component or components of STEG 500 which are controlled for purposes of switching STEG 500 between using geothermal cooling and using rejection of heat to ambient air.

In one embodiment, for example, in which heat sink 510 is connected to the cold side 220 of STEG 500 using one or more variable-conductance heat pipes, the variable conductance heat pipes may be adjusted (e.g., in response to one or more control signals from controller 520) to have low thermal conductivity when geothermal cooling is used to cool the cold side 220 of the STEG 500 and to have high thermal conductivity for the case when rejection of heat to ambient air is used to cool the cold side 220 of the STEG 500.

In one embodiment, for example, in which a fluid pump is used to circulate a cooling fluid to cold side 220 of STEG 500, a valve may be controlled (e.g., in response to one or more control signals from controller 520) to switch the cooling fluid between use for geothermal cooling and use for heat rejection to ambient air.

Although primarily depicted and described with respect to use of specific elements/capabilities to support switching between use of geothermal cooling and rejection of heat to ambient air in order to cool the cold side 220 of STEG 500, it will be appreciated that various other types and/or arrangements of elements/capabilities may be used to support switching between use of geothermal cooling or rejection of heat to ambient air in order to cool the cold side 220 of STEG 500 (e.g., to determine if/when to switch between use of geothermal cooling via the heat transfer structure 140 and use of the mechanism configured to reject heat to ambient air, to switch between use of geothermal cooling via the heat transfer structure 140 and use of the mechanism configured to reject heat to ambient air, and the like as well as various combinations thereof). For example, STEG 500 may be configured to include one or more clocks and/or timers and/or one or more clock and/or timer mechanisms. For example, the STEG 500 may include one or more temperature sensors for measuring the temperature of the earth (e.g., disposed at or near the base 141) and one or more temperature sensors for measuring the temperature of the ambient air (e.g., disposed at or near the TEG 130). For example, the STEG 500 may have access to temperature readings indicative of the temperature of the earth and temperature readings indicative of the temperature of the ambient air (e.g., from any suitable source(s) of such temperature information). For example, STEG 500 may be configured to include one or more controllers and/or processors for processing input information (e.g., timer readings, temperature readings, and the like) detecting switching conditions (e.g., via monitoring of timers, temperature thresholds, and the like), initiating control signals for controlling switching between use of geothermal cooling via the heat transfer structure 140 and use of heat rejection to ambient air via the mechanism configured to reject heat to ambient air, and the like, as well as various combinations thereof.

It is noted that STEG 500 may be configured to support various combinations of such embodiments (e.g., where the STEG 500 may be configured to operate based on advance analysis of the details of deployment of STEG 500 and also may be configured to react to anomalous conditions (e.g., an unusually cool summer, an unusually warm winter, an unusually cool day, an unusually warm day, and the like).

In this manner, STEG 500 may be configured to support static and/or dynamic use of various different STEG cooling mechanisms.

Figure 6:
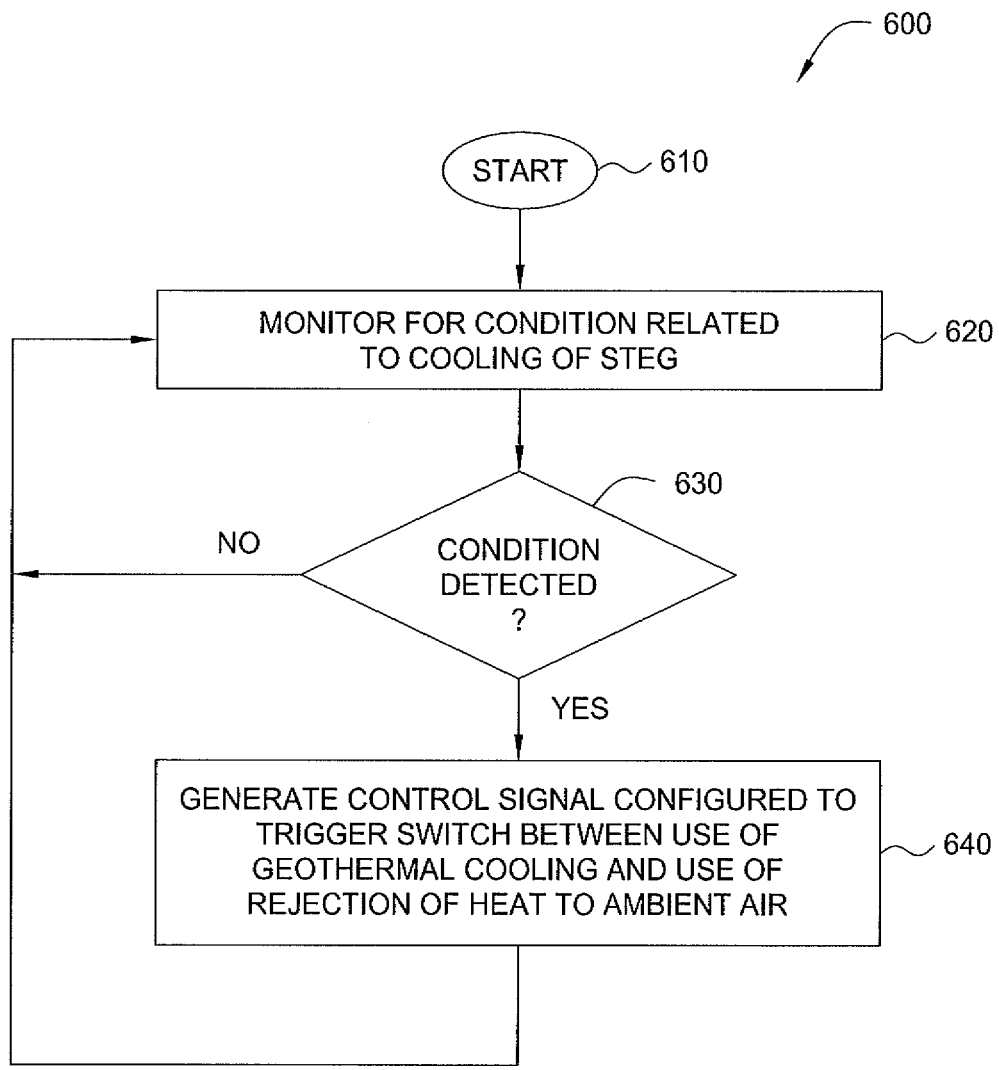
FIG. 6 depicts one embodiment of a method for controlling switching between use of geothermal cooling and use of rejection of heat to ambient air.

FIG. 6 depicts one embodiment of a method for controlling switching between use of geothermal cooling and use of rejection of heat to ambient air. It will be appreciated that method 600 of FIG. 6 may be performed by the controller 520 of FIG. 5 or by any other element suitable for performing method 600 of FIG. 6.

At step 610, method 600 begins.

At step 620, monitoring is performed for use in determining whether a condition related to cooling of a STEG is detected. At step 630, a determination is made as to whether a condition related to cooling of a STEG is detected. The condition related to cooling of the STEG is a condition related to switching between the manner in which the cold side of the STEG is cooled (e.g., via use of geothermal cooling or use of rejection of heat to ambient air). For example, as described herein with respect to FIG. 5, such conditions may include a timer or clock indicating a particular time, a temperature satisfying a threshold, and the like, as well as various combinations thereof. If a condition related to cooling of a STEG is not detected, the method 600 returns step 620 to continue monitoring for a condition related to cooling a STEG. If a condition related to cooling of a STEG is detected, the method 600 proceeds to step 640. Although depicted and described as separate steps for purposes of clarity, it will be appreciated that steps 620 and 630 of method 600 also may be considered to be a single step whereby periodic and/or continuous monitoring is performed in order to determine when a condition is detected.

At step 640, a control signal is generated. The control signal is configured to trigger switch the manner in which the cold side of the STEG is cooled (e.g., from use of geothermal cooling to use of rejection of heat to ambient air or from use of rejection of heat to ambient air to use of geothermal cooling). From step 640, method 600 returns to step 620 to continue monitoring for a condition related to cooling of a STEG.

Although omitted from FIG. 6 for purposes of clarity, it will be appreciated that one or more other steps may be performed after step 640, even as monitoring continues to be performed. For example, the control signal may be propagated to one or more elements of the STEG (e.g., a fluid pump of heat transfer structure of STEG 500, thermal switch 512 of STEG 500, and the like, as well as various combinations thereof).

Various embodiments of the STEGs depicted and described herein can provide comparable performance compared with classical PV harvesters and, thus, can provide a cost-effective solution when compared with classical PV harvesters. At least some embodiments of STEGs depicted and described herein, according to a first order estimation, produce power of approximately 5 W-10 W. At least some embodiments of STEGs depicted and described herein use a TEG 130 having a footprint of approximately 50 $cm^2$-100 $cm^2$. For at least some embodiments of STEGs depicted and described herein, the estimated relative efficiency to Carnot efficiency of the TEG 130 is approximately 10%-20%. At least some embodiments of STEGs depicted and described herein are expected to provide approximately 40%-70% cost reduction when compared with classical PV harvesters.

Various embodiments of the STEGs depicted and described herein overcome the intrinsic limitation of existing STEGs, i.e., worse performance than classical PV harvesters. For example, a first order estimation shows that, in at least some embodiments of STEGs depicted and described herein depicted and described herein, the STEG can generate nearly 70% more energy than existing STEGs (e.g., embodiments of STEGs depicted and described herein may generate approximately 8.8 W, whereas existing STEGs may only generate approximately 5.2 W). Hence, various embodiments of STEGs depicted and described herein provide significant performance improvements over existing STEGs. Furthermore, various embodiments of STEGs depicted and described herein provide such performance improvements at a significant reduction in cost as compared to classical PV harvesters.

Various embodiments of STEGs depicted and described herein have many different applications. For example, a possible application in telecommunications would be for small-scale power generation (e.g., powering sensor nodes in wireless sensor networks, powering small cell base stations, and the like). For example, a possible application in government sectors may be for powering LED traffic lights and/or street lights, powering informational signs, and the like). It is noted that embodiments of STEGs depicted and described herein may be used in various other applications.

Although primarily depicted and described herein with respect to embodiments in which a STEG includes a single TEG (illustratively, TEG 130 of STEG 100 and STEG 500), it is noted that a STEG may include multiple TEGs which may be cooled using any cooling mechanism(s) depicted and described herein. In such embodiments, the multiple TEGs of the STEG may be geometrically arranged in any suitable manner (e.g., serially, in parallel, using one or more arrays of TEGs, and the like, as well as various combinations thereof). In such embodiments, the multiple TEGs of the STEG may be electrically arranged in any suitable manner (e.g., using serial connections, using parallel connections, or using a combination of serial and parallel connections). It is noted that, for the case of a single TEG making up a STEG, it may be advantageous to design the pellet geometry and electrical interconnects such that the electrical resistance of the TEG making up the STEG is close to the electrical resistance of the load that is being driven by the STEG, otherwise the system may operate with sub-optimal efficiency. It is noted that, for the case of multiple TEGs making up a STEG, it may be advantageous to connect the TEGs in series and/or in parallel, to match the resistance of the STEG to the electrical resistance of the load that is being driven by the STEG, so that the system functions at or near optimal/desired operating efficiency.

Figure 7:
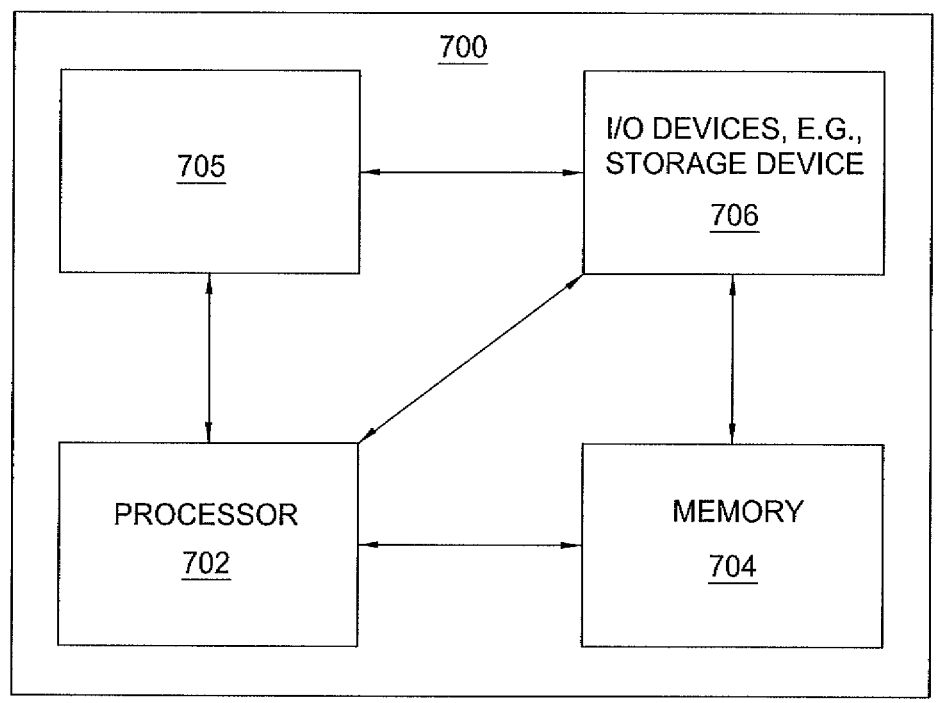
FIG. 7 depicts a high-level block diagram of a computer suitable for use in performing functions described herein.

FIG. 7 depicts a high-level block diagram of a computer suitable for use in performing functions described herein. As depicted in FIG. 7, computer 700 includes a processor element 702 (e.g., a central processing unit (CPU) and/or other suitable processor(s)) and a memory 704 (e.g., random access memory (RAM), read only memory (ROM), and the like). The computer 700 also may include a cooperating module/process 705 and/or various input/output devices 706 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like)). It will be appreciated that functions depicted and described herein may be implemented in software (e.g., via implementation of software on one or more processors) and/or hardware (e.g., using a general purpose computer, one or more application specific integrated circuits (ASIC), and/or any other hardware equivalents). It will be appreciated that functions depicted and described herein may be implemented in software for executing on a general purpose computer (e.g., via execution by one or more processors) so as to implement a special purpose computer, and/or may be implemented in hardware (e.g., using one or more application specific integrated circuits (ASIC) and/or one or more other hardware equivalents). In one embodiment, the cooperating process 705 can be loaded into memory 704 and executed by processor 702 to implement functions as discussed herein. Thus, cooperating process 705 (including associated data structures) can be stored on a computer readable storage medium, e.g., RAM memory, magnetic or optical drive or diskette, and the like. It will be appreciated that computer 700 depicted in FIG. 7 provides a general architecture and functionality suitable for providing various functions associated with various STEG capabilities depicted and described herein. For example, computer 700 may be used to control an active cooling mechanism for a STEG (e.g., controlling a pump or pumps providing active cooling of a STEG). For example, computer 700 may be used to control storage and/or use of energy generated by a STEG. For example, computer 700 may be configured to control switching between use of geothermal cooling and use of heat rejection to ambient air. The computer 700 may provide and/or support various other functions depicted and described herein. It is contemplated that some of the functions discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in fixed or removable media, transmitted via a data stream in a broadcast or other signal bearing medium, and/or stored within a memory within a computing device operating according to the instructions.

Although various embodiments which incorporate the teachings of the present invention have been shown and described in detail herein, those skilled in the art can readily devise many other varied embodiments that still incorporate these teachings.

What is claimed is:
1. An apparatus, comprising:
a thermoelectric generator (TEG) comprising a first side and a second side, the TEG configured to generate electrical energy based on a temperature difference between the first side of the TEG and the second side of the TEG, the first side of the TEG configured to be heated by light energy from solar light incident on the first side of the TEG; and
a heat transfer structure coupled to the second side of the TEG,
wherein the heat transfer structure comprises a base and a support member, wherein a first end of the support member is coupled to the second side of the TEG and a second end of the support member is coupled to the base, wherein the base and a. portion of the support member are configured to be embedded in earth to provide cooling for the second side of the TEG via geothermal cooling,
wherein the heat transfer structure further comprises a fluid and a pump, wherein the fluid is configured to transport heat in a direction from the TEG toward the base of the heat transfer structure for cooling via geothermal cooling, and wherein the pump is configured to circulate the fluid in a direction from the base of the heat transfer structure toward the TEG.

2. The apparatus of claim 1, further comprising:
a light directing mechanism configured to focus the solar light incident on the first side of the TEG;
a solar light concentration mechanism configured to concentrate the solar light onto the light directing mechanism; and
a light-absorbing coating disposed on the first side of the TEG, the light-absorbing coating configured to enhance absorption of the solar light incident on the first side of the TEG.

3. The apparatus of claim 1, wherein the TEG comprises a plurality of pellets disposed between the first side of the TEG and the second side of the TEG, wherein the pellets are configured to increase the temperature difference between the first side of the TEG and the second side of the TEG.

4. The apparatus of claim 3, wherein each pellet has an associated pellet geometry configured to increase the temperature difference between the first side of the TEG and the second side of the TEG.

5. The apparatus of claim 1, wherein the base of the heat transfer structure is embedded in the earth at an approximate depth of between one meter and three meters.

6. The apparatus of claim 1, wherein at least a portion of the heat transfer structure is composed of pyrolytic graphite.

7. The apparatus of claim 1, wherein the heat transfer structure comprises a heat pipe.

8. The apparatus of claim 7, further comprising at least one additional TEG, wherein the heat pipe is configured to cool each of the TEGs.

9. The apparatus of claim 1, further comprising:
a solar light concentration mechanism configured to concentrate the solar light incident on the first side of the TEG.

10. The apparatus of claim 9, wherein the solar light concentration mechanism comprises at least one of a reflective lens or a mirror.

11. The apparatus of claim 9, wherein the solar light concentration mechanism comprises a parabolic lens.

12. The apparatus of claim 1, further comprising:
a light directing mechanism configured to focus the solar light incident on the first side of the TEG.

13. The apparatus of claim 12, wherein the light directing mechanism comprises a Fresnel lens.

14. The apparatus of claim 12, further comprising:
a solar light concentration mechanism configured to concentrate the solar light on the light directing mechanism.

15. The apparatus of claim 1, wherein the TEG is configured to be located below the surface of the earth, wherein the apparatus further comprises a light directing mechanism configured to focus the solar light incident on the first side of the TEG onto the first side of the TEG below the surface of the earth.

16. The apparatus of claim 1, further comprising:
a mechanism configured to reject heat from the second side of the TEG to ambient air to provide cooling for a portion of the TEG.

17. The apparatus of claim 16, further comprising:
a controller configured to switch, in response to a condition, between use of geothermal cooling via the heat transfer structure to cool the second side of the TEG and use of the mechanism configured to reject heat from the second side of the TEG to ambient air to cool the second side of the TEG.

18. The apparatus of claim 17, wherein the controller is configured to use the mechanism configured to reject heat from the second side of the TEG to ambient air when a temperature of the ambient air is less than a threshold.

19. The apparatus of claim 16, wherein the threshold has a value, wherein the value is dependent on a temperature of the earth and a relative heat transfer efficiency associated with the heat transfer structure and the mechanism configured to reject heat from the second side of the TEG to ambient air.

\* \* \* \* \*